United States Patent
Gong et al.

(10) Patent No.: US 10,608,184 B2
(45) Date of Patent: Mar. 31, 2020

(54) ORGANIC POLYMER PHOTO DEVICE WITH BROADBAND RESPONSE AND INCREASED PHOTO-RESPONSITIVITY

(71) Applicants: Xiong Gong, Hudson, OH (US); Stephen Z. D. Cheng, Richfield, OH (US)

(72) Inventors: Xiong Gong, Hudson, OH (US); Stephen Z. D. Cheng, Richfield, OH (US)

(73) Assignee: THE UNIVERSITY OF AKRON, Akron, OH (US)

( * ) Notice: Subject to any disclaimer, the term of this patent is extended or adjusted under 35 U.S.C. 154(b) by 0 days.

(21) Appl. No.: 14/649,049

(22) PCT Filed: Dec. 3, 2013

(86) PCT No.: PCT/US2013/072856
§ 371 (c)(1),
(2) Date: Jun. 2, 2015

(87) PCT Pub. No.: WO2014/089066
PCT Pub. Date: Jun. 12, 2014

(65) Prior Publication Data
US 2015/0318481 A1    Nov. 5, 2015

Related U.S. Application Data

(60) Provisional application No. 61/702,785, filed on Dec. 3, 2012, provisional application No. 61/738,000, filed on Dec. 17, 2012.

(51) Int. Cl.
*H01L 51/00*    (2006.01)
*C08K 3/04*    (2006.01)
(Continued)

(52) U.S. Cl.
CPC ........ *H01L 51/0043* (2013.01); *C08G 61/123* (2013.01); *C08G 61/126* (2013.01);
(Continued)

(58) Field of Classification Search
CPC ............. H01L 51/0036; H01L 51/0047; H01L 51/4253; H01L 31/03529;
(Continued)

(56) References Cited

U.S. PATENT DOCUMENTS 9,722,198 B2 *    8/2017    Murayama ........... C09K 11/565
2005/0236556 A1 *   10/2005    Sargent ................. B82Y 10/00
                                          250/214.1
(Continued)

FOREIGN PATENT DOCUMENTS

WO    2005106965 A1    11/2005

OTHER PUBLICATIONS

Ming Wang et al., Donor-Acceptor Conjugated Polymer Based on Naphthol[1,2-c:5,6-c]bis[1,2,5]thiadiazole for High-Performance Polymer Solar Cells, Jun. 1, 2011, Journal of the American Chemical Society, 133, 9638-9641.*

(Continued)

*Primary Examiner* — Nduka E Ojeh
(74) *Attorney, Agent, or Firm* — Renner Kenner Greive Bobak Taylor and Weber; Ray Weber; Tim Hodgkiss (57) ABSTRACT

An organic polymer photo device with broadband response and high photo-responsivity includes an anode terminal with a hole transporting network, and a cathode terminal with an electron transporting network. Positioned in electrical communication with the hole transporting network and the electron transporting network is a blended material that has at least one organic polymer light absorbing component. The organic light absorbing component is configured to have a collection length that is larger than the distance to the (Continued)

nearest electron transporting network and hole transporting network. As such, the blended material forms a light absorbing area that has a dimension that is greater than the collection length of the organic polymer light absorbing component.

14 Claims, 7 Drawing Sheets

(51) Int. Cl.
    *C08G 61/12*     (2006.01)
    *H01L 51/42*     (2006.01)

(52) U.S. Cl.
    CPC ............ *C08K 3/04* (2013.01); *H01L 51/0036* (2013.01); *C08G 2261/149* (2013.01); *C08G 2261/1412* (2013.01); *C08G 2261/1424* (2013.01); *C08G 2261/1426* (2013.01); *C08G 2261/3223* (2013.01); *C08G 2261/3246* (2013.01); *C08G 2261/91* (2013.01); *H01L 51/0053* (2013.01); *H01L 51/4253* (2013.01)

(58) Field of Classification Search
    CPC ......... H01L 31/022425; H01L 51/0043; H01L 51/0053; H01L 51/4213; H01L 2251/308; H01L 2251/552; H01L 51/0037; H01L 51/0048; C08G 61/123; C08G 61/126; C08G 2261/1412; C08G 2261/1424
    USPC ....... 257/40, E51.001, 431, 448; 438/82, 57; 136/256, 244, 261
    See application file for complete search history.

(56) References Cited

U.S. PATENT DOCUMENTS

| | | | |
|---|---|---|---|
| 2007/0057339 A1* | 3/2007 | Mitsui | H01L 27/14647 257/432 |
| 2007/0235727 A1 | 10/2007 | Setayesh et al. | |
| 2008/0176030 A1* | 7/2008 | Fonash | B82Y 20/00 428/119 |
| 2010/0326524 A1* | 12/2010 | Ihn | H01L 51/4253 136/261 |
| 2011/0203632 A1* | 8/2011 | Sen | B82Y 10/00 136/244 |
| 2012/0055536 A1* | 3/2012 | Saito | B82Y 10/00 136/245 |
| 2012/0175593 A1* | 7/2012 | Murayama | H01L 31/035218 257/13 |
| 2014/0070191 A1* | 3/2014 | So | H01L 27/3227 257/40 |
| 2014/0117286 A1* | 5/2014 | Jun | C09K 11/025 252/301.6 S |
| 2014/0326303 A1* | 11/2014 | Shiino | H01L 31/042 136/255 |

OTHER PUBLICATIONS

Ting Yang et al., Inverted polymer solar cells with 8.4% efficiency by conjugated polyelectrolyte, Jun. 11, 2012, Energy & Environmental Science, 5, 8208-8214.*

C. Deibel et al., "Polymer-fullerene bulk heterojunction solar cells", Reports on Progress in Physics, Institute of Physics Publishing, Bristol, GB, vol. 73, No. 9, pp. 1-39, Aug. 18, 2010.

R. C. Hiorns et al., "Synthesis of Donor-Acceptor Multiblock Copolymers Incorporating Fullerene Backbone Repeat Units", Macromolecules, vol. 43, No. 14, pp. 6033-6044, Jul. 27, 2010.

C. Li et al., "A fullerene-single wall carbon nanotube complex for polymer bulk heterojunction photovoltaic cells", Journal of Materials Chemistry, The Royal Society of Chemistry, GB, vol. 17, No. 23, pp. 2406-2411, Mar. 12, 2007.

European Patent Office, Supplementary European Search Report, EP Application No. 13 86 0301, dated Jun. 8, 2016.

* cited by examiner

PBEHTB

ORGANIC POLYMER PHOTO DEVICE WITH BROADBAND RESPONSE AND INCREASED PHOTO-RESPONSITIVITY

CROSS-REFERENCE TO RELATED APPLICATIONS

This application claims priority from International Application No. PCT/US2013/072856 filed Dec. 3, 2013, which claims priority from U.S. Provisional Application No. 61/702,785 filed on Dec. 3, 2012 and U.S. Provisional Application No. 61/738,000 filed on Dec. 17, 2012, whereby the content of each application is incorporated herein by reference.

TECHNICAL FIELD

Generally, the present invention relates to polymer photo devices, such as photovoltaics and photodetectors. In particular, the present invention relates to a polymer photo device that utilizes an organic polymer light absorbing component that has a carrier collection length that is larger than the distance to the nearest electron transporting network and hole transporting network. More particularly, the present invention is directed to a polymer photo device in which an organic polymer light-absorbing component is incorporated into a blended material that is formed to have a light-absorbing area that has a dimension that is greater than the carrier collection length of the organic light absorbing component.

BACKGROUND OF THE INVENTION

Interest in organic semiconductor photo devices, such as organic photodetectors (PD) and photovoltaic cells (PV), has increased because such devices can now be inexpensively fabricated on any suitable substrate, such as flexible substrates or non-planar/curved substrates. However, due to the reduced mobility of charge carriers associated with organic semiconductors, current generation photo devices suffer from many drawbacks, including reduced operating performance. For example, key performance characteristics associated with the operation of photodetectors (PD) are responsivity and noise, while the key performance characteristics associated with the operation of photovoltaic cells (PV) are short circuit current ($I_{sc}$), open circuit voltage (Voc), and fill factor (FF). The responsivity of photodetectors (PD), and similarly the short circuit current ($I_{sc}$) of photovoltaic cells (PV), is determined by the amount of light that is permitted to be absorbed by the photo device, along with its charge carrier collection efficiency. In particular, the ability of a photo device to absorb light depends primarily on the thickness of the absorbing layer of the photo device. Alternatively, the carrier collection efficiency of the photo device depends on the diffusion length of the charge carriers relative to the distance from the location of the photo carrier generation to a collecting junction.

To achieve desired levels of light absorption and carrier collection efficiency, the standard method of making PIN photo detectors (PD) or photovoltaic (PV) cells, where a p-type material is used as an insulator or an n-type material is used as an absorbing layer, is not feasible. Specifically, to obtain a sufficient amount of light absorption, the absorbing layer of the photo device must be on the order of microns (μm) thick. Furthermore, the diffusion length of the photo device can be calculated by the formula $L=(\mu \tau V_t)^{1/2}$, where L is the diffusion length, Vt is the thermal voltage (0.0259 eV at room temperature), μ is the carrier mobility, and τ is the charge carrier lifetime. The diffusion length (L) for a typical charge carrier mobility of $10^{-3}$ cm$^2$/Vsec and a typical carrier lifetime of 100 ns in organic materials is about 16 nm. Such a diffusion length (L) is substantially shorter than the distance from the location of the absorption layer to the collecting junction (e.g. approximately the micron thickness of the absorbing layer in a standard photo device). Thus, the thickness of the light absorbing layer required for photo devices of current designs to obtain sufficient light absorption is too long to provide satisfactory carrier collection efficiency.

Another problem associated with the fabrication of photo devices is noise, and specifically, in the case of photovoltaic (PV) devices, low open circuit voltage (Voc). For example, one of the major contributions to noise in photodetectors, and to low open-circuit voltages (Voc) in photovoltaic devices is dark current. Dark current results from either band-to-band leakage or from defect leakage in the photo device. In particular, band-to-band leakage depends on the bandgap, which is determined by the wavelength of the received light, while defect leakage is the result of surface/interface defects in the photo device. As such, defect leakage is the primary leakage current for most photo devices, including photodetector (PD) devices and photovoltaic (PV) devices. Carbon nanotubes, such as II-VI nanorods, typically have benign surface properties and are suited for non-crystalline applications. Thus, even though these non-crystalline organic materials have a substantial amount of interface defects, such defects are benign and do not contribute to carrier recombination. The defect leakage current is further reduced due to the low-charge carrier mobility, which tends to localize the effect of the leakage current associated with the defect.

Therefore, there is a need for a polymer photo device, such as a photodetector (PD) or photovoltaic cell (PV) that utilizes a light-absorbing material, which is able to absorb light over a wide spectral range, so as to provide broadband operation. In addition, there is a need for a polymer photo device, such as a photodetector (PD) or photovoltaic cell (PV) that utilizes a light-absorbing material, which enables increased carrier collection efficiency. Furthermore, there is a need for a polymer photo device, which has increased photo responsivity or light absorption. In addition, there is a need for a polymer photo device, such as a photodetector (PD) or photovoltaic cell (PV) that utilizes a light-absorbing material that allows the photo device to have reduced dark current.

SUMMARY OF THE INVENTION

In light of the foregoing, it is a first aspect of the present invention to provide a photo device comprising an anode terminal including a hole transporting network and a cathode terminal including an electron transporting network; and a blended material including at least one organic light absorbing component that is positioned in electrical communication with the hole transporting network and the electron transporting network, wherein the at least one organic light absorbing component has a collection length that is larger than a distance to the nearest electron transporting network and hole transporting network, and wherein the blended material has a light absorbing area with a dimension that is greater than the collection length of the at least one organic light absorbing component.

It is a further aspect of the present invention to provide a photo device comprising an anode terminal including a hole transporting network and a cathode terminal including an electron transporting network; and a blended material including a plurality of light absorbing components, each light absorbing component positioned in electrical communication with the hole transporting network and the electron transporting network, wherein each one of the plurality of organic light absorbing components has a collection length that is larger than a distance to the nearest electron transporting network and hole transporting network, and wherein each one organic light absorbing component configured to absorb light in a different frequency band, and the blended material having a light absorbing area with a dimension that is greater than the collection length of any of the plurality of organic light absorbing components.

Yet another aspect of the present invention is to provide a method of fabricating a photo device comprising providing an anode terminal having a hole transporting network and a cathode terminal including an electron transporting network; adjusting at least one organic light absorbing component to have a collection length that is larger than a distance to the nearest electron transporting network and hole transporting network; and forming a blended material that includes the organic light absorbing component, particles of the hole transporting network and particles of the electron transporting network, the blended material in electrical communication with the hole transporting network and the electron transporting network; wherein the blended material defines a light absorbing area that has a dimension that is greater than the collection length of the organic light absorbing component.

BRIEF DESCRIPTION OF THE DRAWINGS

These and other features and advantages of the present invention will become better understood with regard to the following description, appended claims, and accompanying drawings wherein:

FIGS. 2A-D is a molecular diagram of a three component photo device, wherein a light absorbing material is included in accordance with the concepts of the present invention;

DETAILED DESCRIPTION OF THE INVENTION

Figure 1:
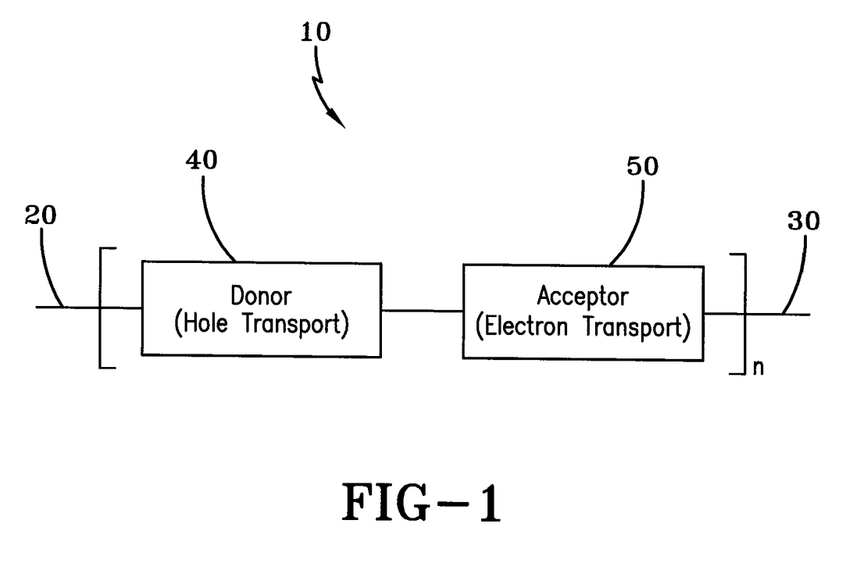
FIG. 1 is a molecular diagram of a two component photo device, wherein one of the components includes light-absorbing material in accordance with the concepts of the present invention.
Figure 2:
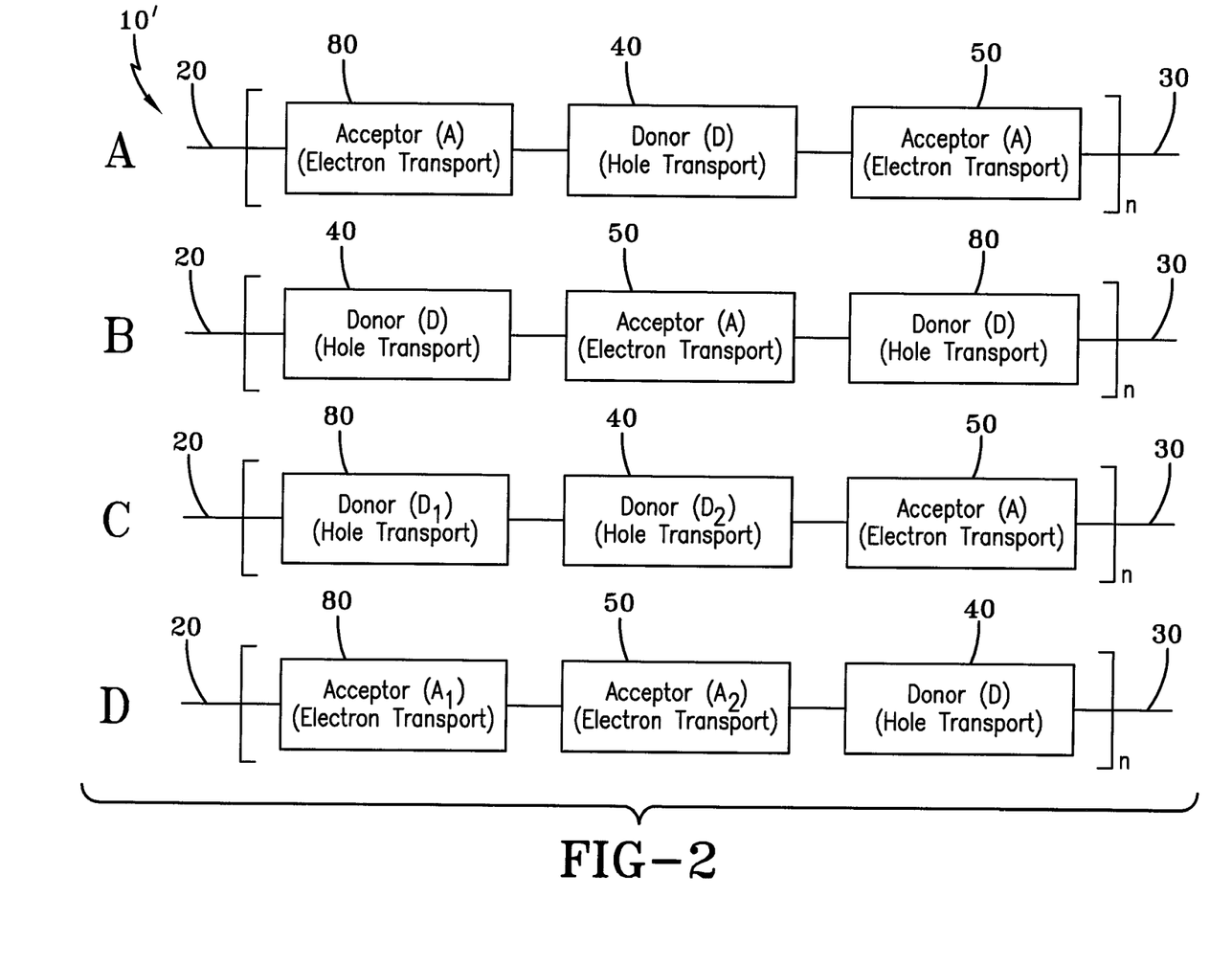

A polymer photo device, generally referred to by numeral 10, is shown in FIG. 1 of the drawings. The two-component photo device 10 includes an anode 20 and a cathode 30, which serve as electrical contacts or electrodes. In one aspect, the anode 20 may comprise a high work-function material, such as indium-tin-oxide (ITO), while the cathode 30 may comprise a low work-function material, such as calcium, barium, aluminum or silver, in order to achieve band gap alignment. A hole transporting material 40, or electron donor (D), is provided in contact with the anode 20, while an electron transporting material 50, or electron acceptor (A), is positioned in contact with the hole transporting material 40 and the cathode 30. In one aspect, the hole transporting material 40 may comprise p-type conjugated polymers and p-type organic semiconductor material, while the electron transporting material 50 may comprise n-type conjugated polymers and n-type organic semiconductor material.

Thus, to achieve enhanced carrier collection efficiency and an enhanced amounts of light absorption, the highest occupied molecular orbital (HOMO), which is the conduction band in semiconductor materials, and the lowest unoccupied molecular orbital (LUMO), which is the lowest valence band in semiconductor materials, of each organic component 40,50 in the photo device 10 is configured so that they are aligned. As such, the LUMO of the hole transporting material 40 is higher than the LUMO of the electron transporting material 50 if the hole transporting material 40 is to be used as a light absorbing component. This allows the electrons generated in the hole transporting material 40 during the absorption of light to readily transfer or travel to the electron transporting material 50, thus generating the desired electric current.

On the other hand, if the electron transporting material 50 is to be used as the light-absorbing component, then the HOMO of the electron transporting material 50 has to be lower than the HOMO of the hole transporting material 40. This allows the holes generated in the electron transporting material 50 during the absorption of light to readily transfer or travel to hole transporting material 40, and thus generate the desired electric current.

In the photo device of the present invention, the width of the optical response spectra is improved by adding additional absorbing components or materials. That is, the additional light absorbing components are specifically selected to broaden the spectral response of the photo device 10. The absorbing components do not have to be able to transport charge strongly themselves and do not have to form a continuous network of their own. However, the light absorbing components need to have intimate contacts with both the electron transporting material (or network) and the hole transporting material (or network). Otherwise, the charge carriers generated by the absorbed light will be lost.

In accordance with the present invention, the optimal situation is to have the absorbing components within a collection length of both the electron transporting network and the hole transporting network simultaneously. The collection length of the light absorbing material is determined by the carrier lifetime τ, mobility μ, and the built-in voltage $V_{bi}$, whereby the collection length is defined as $Lc=(\mu\tau V_{bi})^{1/2}$. If there is no significant built-in field, then the built-in voltage is replaced by the thermal voltage Vt. Typically, Vt is much smaller than the built-in voltage between the electron and hole transport networks. It is important that the light absorbing component is sandwiched or otherwise disposed between the electron and hole transporting networks to obtain a strong built-in field to improve the carrier collection length. In order to have good collection efficiency, it is important to have Lc of the absorbing component larger than the distance to the nearest electron and hole transporting network.

With regard to the alternative photo device 10' shown in FIGS. 2A-D, an additional light absorbing component or material 80 is added to the hole transporting material 40 and the electron transporting material 50, such that it is in contact with both the hole and electron materials 40 and 50. In the structures shown, the LUMO of the electron transporting material 40 is lower than the LUMO of the absorbing component 80. Further, to complete the electrical path, the HOMO of the hole transporting material 40 has to be higher than the HOMO of the light-absorbing material 80. Thus, it can be seen that the various materials in the organic photo device 10' may be readily adjusted or tuned more easily than inorganic materials, thus providing virtually infinite possibilities.

Figure 3:
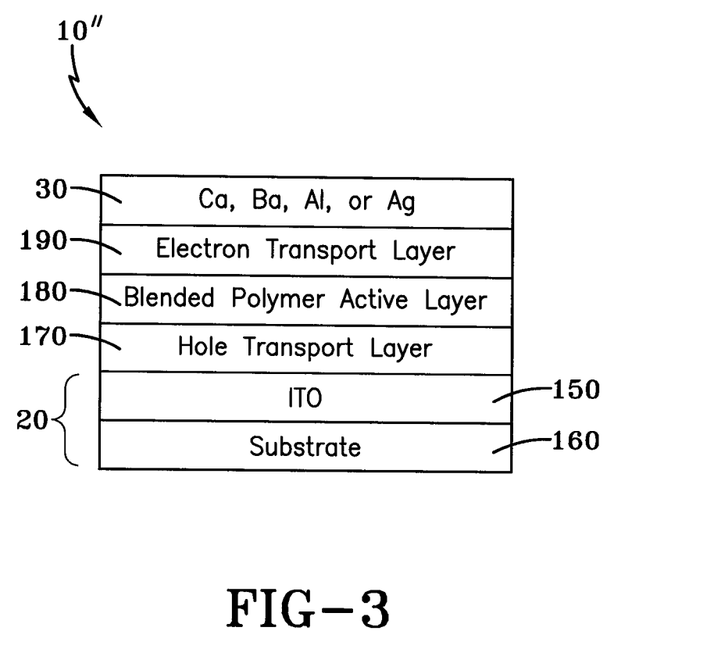
FIG. 3 is a schematic view of a photo device in accordance with the concepts of the present invention.

Continuing to FIG. 3, an alternative polymer photo device 10" is shown. Specifically, the anode 20 of the photo device 10" includes a high work-function electrical contact material, such as an indium-tin-oxide (ITO) layer 150, that is disposed upon an at least partially light transparent substrate layer 160. A hole transporting layer (HTL) 170 is positioned in contact with the ITO layer 150 of the anode 20, and may optionally be provided as a separate layer or may be provided as a component of a blended polymer active layer 180 to be discussed. The blended polymer active layer 180 is disposed upon the hole transporting layer 12, and may include one or more light absorbing materials. An electron transporting layer (ETL) 190 is disposed upon the blended polymer active layer or material 180, and may optionally be a separate layer or may be provided as a component of the blended polymer layer 180. The cathode 30 is disposed upon the electron transport material 190, and generally comprises a low work-function electrical contact material, including but not limited to calcium (Ca), barium (Ba), aluminum (Al), or silver (Ag). In one embodiment, the anode terminal 20 and the cathode terminal 30 are printable metal disposed on an organic material, so that the entire photo device 10" can be fabricated on any suitable substrate, such as a flexible substrate.

It should be appreciated that one or both of the hole transporting layer 170 and electron transporting layer 190 may be light absorbing materials, and as such, may be included in the blended polymer layer 180. Also, the blended polymer active layer 180 can include one or more light absorbing materials in addition to, or instead of, hole transporting material and electron transporting material. Regardless of the position or the material used as the hole transporting material, it should be understood that one or more hole transporting networks are formed that convey or otherwise transport holes to the anode 20 in the photo device 10". Similarly, regardless of the position or material used as the electron transporting material, it should be understood that one or more electron transporting networks are formed, which convey or otherwise transport electrons to the cathode 30 in the photo device 10". Furthermore, each combination of the hole transporting network light absorbing material-electron transporting network is specifically designed or tailored to meet the energy band requirements illustrated in FIG. 2.

It should also be appreciated that the present invention blends light-absorbing materials, which will be discussed in detail below, to achieve a relatively large light-absorbing area, while retaining a collection length (Lc) that is larger than the distance to the nearest electron and hole transporting network. Because random blending does not guarantee desired results, the blended material 180 in the photo device 10 is specifically designed and constructed so that many or all particles of the light-absorbing material contact both a hole transporting network and an electron transporting network.

Figure 4:
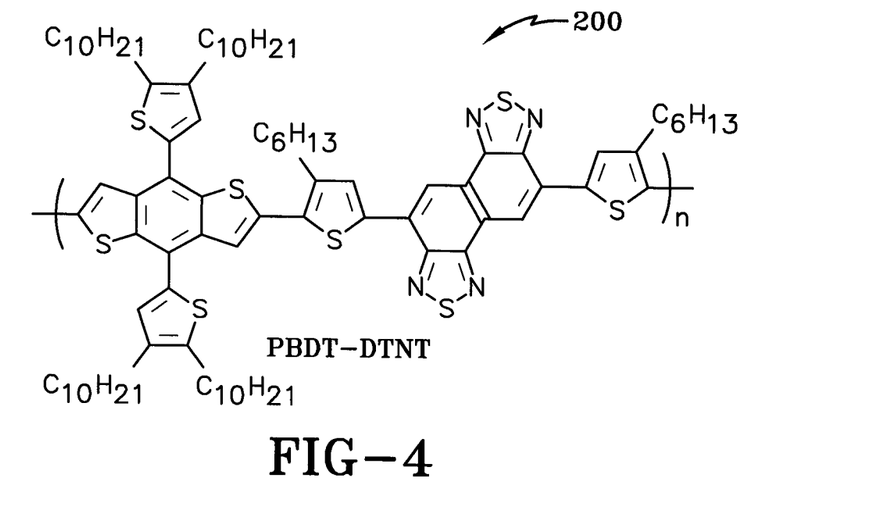
FIG. 4 is a molecular diagram of PBDT-DTNT that may be utilized as a nanorod in accordance with the concepts of the present invention.

With regard to the composition of the light absorbing materials used by the photo devices 10, 10' and 10", it should be appreciated that such materials may include light-absorbing components that are in the shape of a long tube or rod, hereinafter referred to as a nanorod 200, such as PBDT-DTNT shown in FIG. 4. The length of the nanorods 200 is much longer than the blending grain size, such that each nanorod simultaneously has intimate contact with both the hole transporting network layer and the electron transporting network layer of the photo devices 10, 10' and 10". The material of the nanorods 200 is configured, such that the mobility of the charge carriers can reach the contacting electron and hole transporting networks or layers of the photo devices 10, 10' and 10" by diffusion. Examples of some specific nanorods 200 that can be utilized by the photo devices 10, 10', and 10" include, but are not limited to single wall carbon nanotubes and II-VI element nanorods where the surface states can be well passivated and the carrier mobility is relatively high. By intermixing nanotubes, materials with different absorbing bandwidths, the overall absorption bandwidth of the photo devices 10, 10', and 10" can be extended.

In yet another embodiment, the photo device 10, 10', and 10" may provide absorbing molecules (i.e. molecules of the light-absorbing material) that are sandwiched or otherwise disposed between a hole transporting molecule of a hole transporting network or layer and an electron transporting molecule of an electron transporting network or layer. Continuity can be provided by synthesizing the hole transporting molecule, the absorbing molecule, and the electron transporting molecule onto a polymer backbone. Such pre-synthesized material ensures simultaneous contact of the light absorbing molecules with both the hole transporting molecules and the electron transporting molecules of the photo devices 10, 10' and 10".

Figure 5:
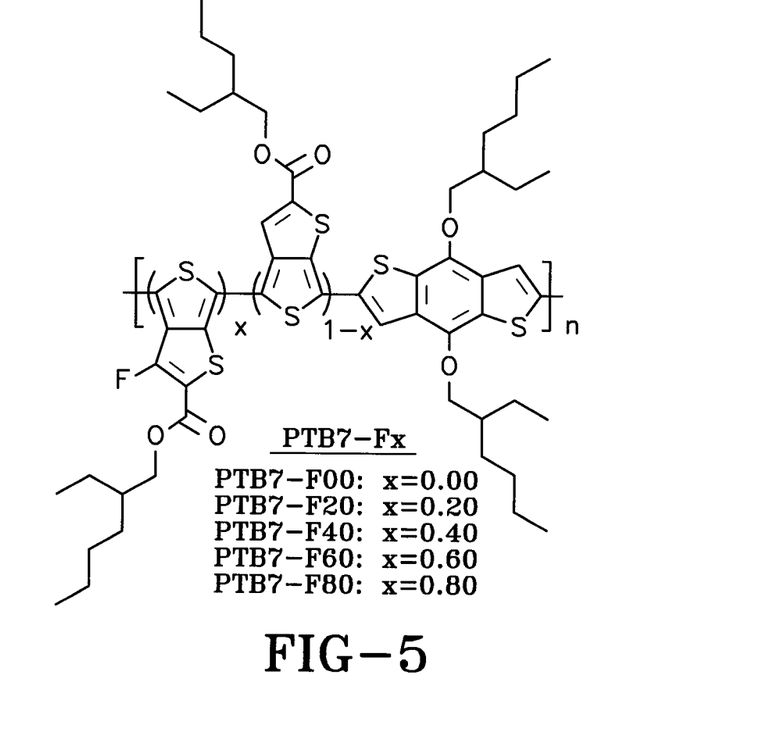
FIG. 5 is an alternative embodiment of pre-synthesized material used to fabricate the photo device in accordance with the concepts of the present invention.
Figure 6:
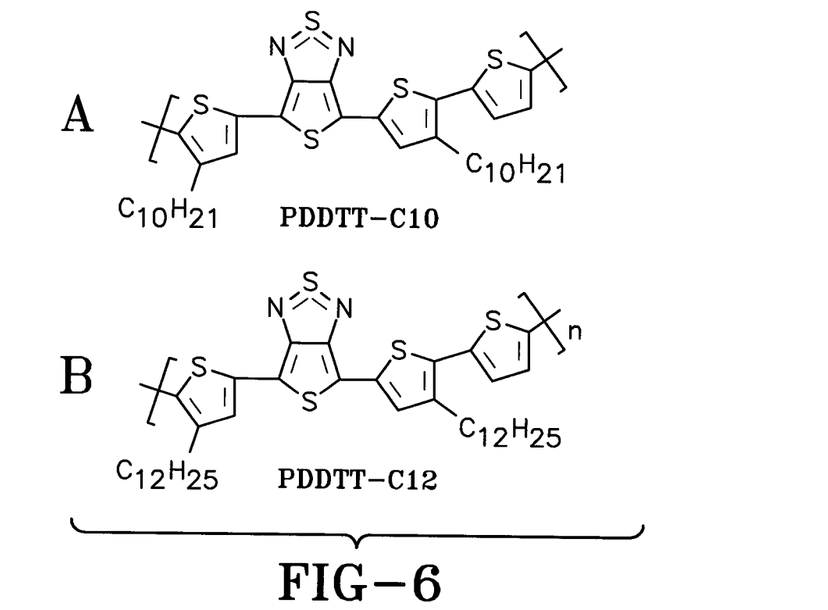
FIG. 6A is another alternative embodiment of pre-synthesized material used to fabricate the photo device in accordance with the concepts of the present invention.
FIG. 6B is another alternative embodiment of the pre-synthesized material used to fabricate the photo device in accordance with the concepts of the present invention.
Figure 7:
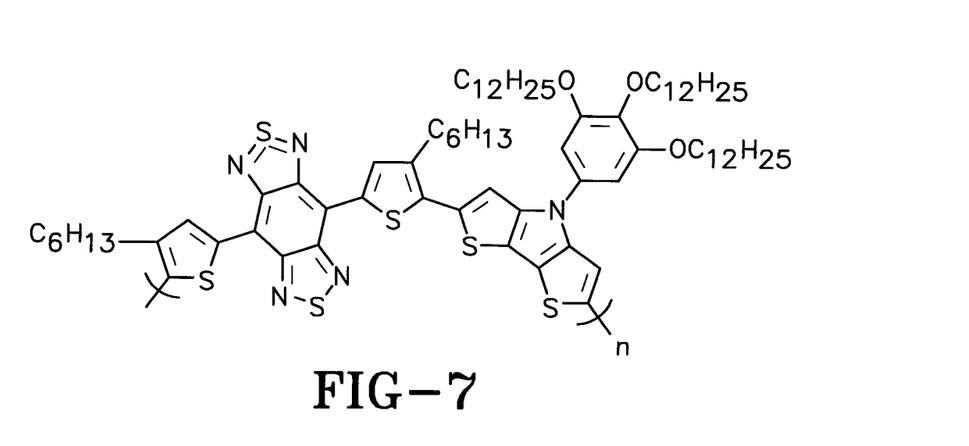
FIG. 7 is another alternative embodiment of pre-synthesized material used to fabricate the photo device in accordance with the concepts of the present invention.

Referring now to FIGS. 5, 6A-B, and 7, several embodiments are shown of pre-synthesized materials, which may be used to improve the operation of the organic photo devices 10, 10', and 10". In particular, the Figs. show that the required interfaces can be enhanced by synthesizing the interface molecules onto a polymer backbone with the proper spatial relationship. In one aspect, FIG. 5 shows PTB7-F00, PTB7-F20, PTB7-F40, PTB7-F60, and PTB7-F80 as pre-synthesized materials that can be utilized by the organic photo devices 10, 10', and 10". Moreover, in one example two different hole transporting absorbing materials D1 and D2 may be pre-synthesized on a polymer backbone so that they are in intimate contact with electron transporting material A. In another example, two different electron transporting or non-continuous absorbing materials I1 and I2 may be pre-synthesized on a polymer backbone so that they are in intimate contact with the hole transporting material D and the electron transporting material A. In these examples, it is shown that the transporting molecules can be shared by absorbing molecules.

A variety of different synthesis techniques and examples are possible for use with the present invention. For example, in a first synthesis example, two co-polymers are synthesized, one of which has a light absorption bandwidth that covers wavelengths from about 400 nm to 1000 nm, and a second of which has a bandwidth that covers wavelengths from about 1000 nm to 2000 nm.

Co-polymerization:
D1+A1 ⟶ D1–A1; or
Co-polymerization:
D1+A2 ⟶ D1–A2; or
Co-polymerization
D2+A1 ⟶ D2–A1; or
Co-polymerization
D2+A2 ⟶ D2–A2

In a second synthesis example, one component polymer is used whose absorption bandwidth covers wavelengths from about 400 nm to 2000 nm.

Co-polymerization
D1+A1+D2 ⟶ D1–A1–D2; or
Co-polymerization
D1+A2+D2 ⟶ D1–A2–D2

In a third synthesis example, one component polymer is used, whose absorption bandwidth that covers wavelengths from about 40 nm to 1000 nm.

Co-polymerization
A+I1+D+I2+A ⟶ A–I1–D–I2–A; or
Co-polymerization
A+I1+D ⟶ A–I1–D
Co-polymerization
A+I2+D ⟶ A–I2–D.

Figure 8:
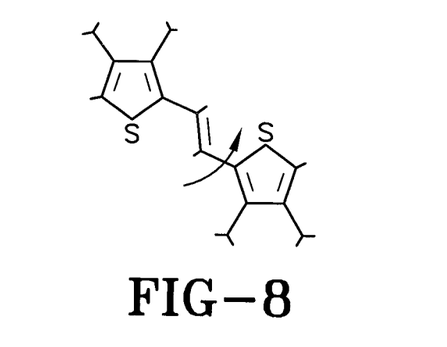
FIG. 8 is a polygon formula for oligo(thienylenevinylene)
Figure 9:
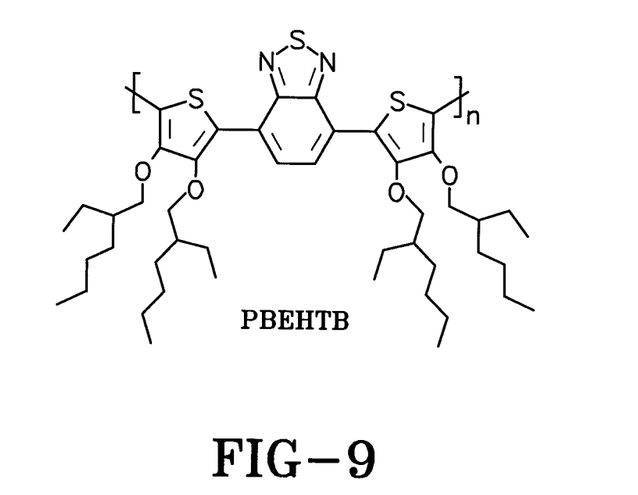
FIG. 9 is a polygon formula for 3',4,3',4'-tetrakis[2-ethylhexyloxy]-2,2'-bitiophene (PBEHTB)
Figure 10:
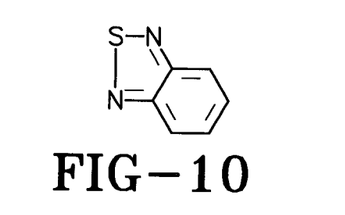
FIG. 10 is a polygon formula for electron deficient 2,1,3-benzothidiazole.
Figure 11:
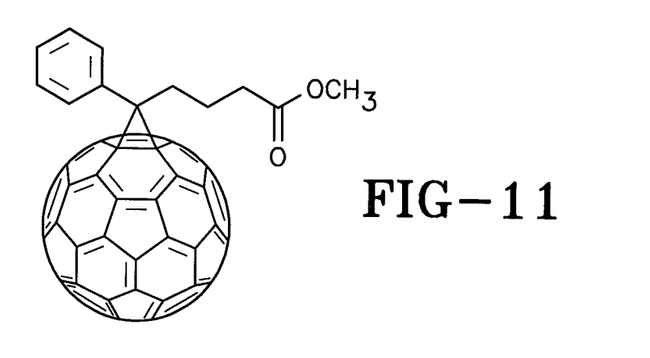
FIG. 11 is a polygon formula for PCBM.
Figure 12:
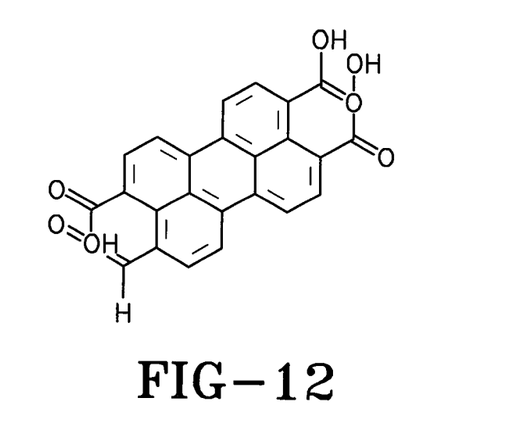
FIG. 12 is a polygon formula for perylene-3,4,9,10-tetracarboxyl-bis-benzimidazole (PTCBI)
Figure 13:
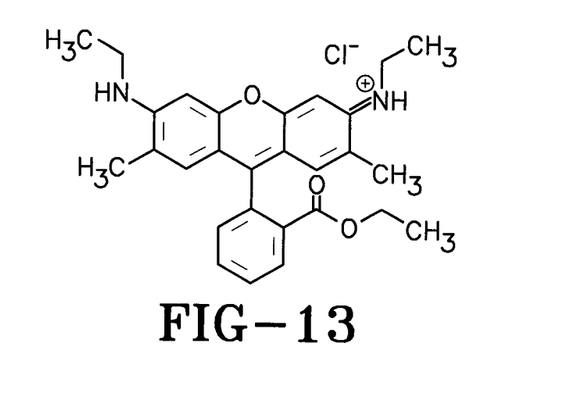
FIG. 13 is a polygon formula for one PRNM (R6G derivative).

In the co-polymerization synthesis examples shown above, a polymer that may be used as D1 whose light absorption covers from about 400 nm to 1000 nm includes oligo(thienylenevinylene) or OTV, as shown in FIG. 8. Another polymer that may be used as D1, whose absorption covers a spectral range from about 400 nm to 1000 nm includes 3',4,3',4'-tetrakis[2-ethylhexyloxy]-2,2'-bitiophene (PBEHTB), as shown in FIG. 9. In the above co-polymerization synthesis, an example of a polymer that may be used as D2, whose absorption covers a spectral range from about 1000 nm to 2000 nm includes electron-deficient 2,1,3-benzothidiazole, as shown in FIG. 10. Furthermore, in the above co-polymerization synthesis, an example of a polymer that may be used as A1 is PCBM, as shown in FIG. 11. Moreover, examples of polymers that may be used as A2 include perylene-3,4,9,10-tetracarboxyl-bis-benzimidazole (PTCBI), shown in FIG. 12, and PRNM (R6G derivatives), shown in FIG. 13. However, it should be appreciated that any other suitable polymer Thus, the photo devices 10, 10' and 10" are configured whereby one or more light absorbing organic polymer materials is blended into the structure of the photo device, with the cathode and the anode electrodes, in large enough quantities (e.g. sufficient thickness of the absorbing layer) to obtain sufficient or practical amounts of light absorption or high responsivity, so as to increase the generated electrical current. In other words, the blended material has a light absorbing area with a dimension (e.g. width, height, and/or length) that is greater than the collection length of the light absorbing component and generally many times greater. The light absorbing organic polymer materials are specifically designed so that the absorbing components will be in intimate contact with both hole and electron transporting networks simultaneously, and the carrier collection length Lc of the absorbing component is larger than the distance to the nearest electron and hole transporting network, so as to provide enhanced carrier collection efficiency. One or both of the electron and hole transporting materials may be configured as light absorbing materials and/or one or more additional light absorbing organic polymer materials may be blended into the photo device, so as to be in intimate contact with both hole and electron transporting networks simultaneously. Furthermore, various light absorbing organic materials contemplated by the present invention may have different light absorbing bands or bandwidths so that a broad band (large optical response spectra) of light absorption is achieved.

Therefore, one advantage of the present invention is that a polymer photo device has increased light absorption. Still another advantage of the present invention is that the polymer photo device has increased optical response spectra. Yet another advantage of the present invention is that the polymer photo device utilizes an organic light absorbing component that has a carrier collection length that is larger than the distance to the nearest electron transporting network and hole transporting network. Another advantage of the present invention is that the polymer photo device utilizes a blended material that includes a light absorbing component, whereby the blended material is formed into a light absorbing area that has a dimension that is greater than the collection length of the organic light absorbing component.

Thus, it can be seen that the objects of the invention have been satisfied by the structure and its method for use presented above. While in accordance with the Patent Statutes, only the best mode and preferred embodiment has been presented and described in detail, it is to be understood that the invention is not limited thereto or thereby. Accordingly, for an appreciation of the true scope and breadth of the invention, reference should be made to the following claims.

What is claimed is:
1. A photo device comprising:
a first electrode;
a second electrode;
a hole transporting network disposed on said first electrode, said hole transporting network formed of a plurality of molecules;
an electron transporting network disposed on said second electrode, said electron transporting network formed of a plurality of molecules; and
an active layer includes a plurality of light absorbing molecules each having a different light absorption bandwidth, said hole transporting molecules and said electron transporting molecules together forming a polymer backbone chain, wherein said plurality of molecules of said hole transporting network, and said plurality of molecules of said electron transporting network are shared with said light absorbing molecules, such that said hole transporting network is in electrical communication with said electron transporting network.

2. The photo device of claim 1, wherein at least one of said plurality of light absorbing molecules has an optical response spectra of between about 300 nm to 2000 nm.

3. The photo device of claim 1, wherein at least one of said plurality of light absorbing molecules has an optical response spectra of between about 300 nm to 1000 nm.

4. The photo device of claim 1, wherein at least one of said plurality of light absorbing molecules has an optical response spectra of between about 1000 nm to 3000 nm.

5. The photo device of claim 1, wherein said plurality of hole transporting molecules comprise oligo(thienylenevinylene) (OTV), 3',4,3',4-tetrakis[2-ethylhexyloxy]-2,2'-bitiophene (PBEHTB) or electron deficient 2,1,3-benzothidiazole.

6. The photo device of claim 1, wherein said hole transporting network includes light absorbing material.

7. The photo device of claim 1, wherein said at least one electron transporting molecules comprise [6,6]-phenyl-$C_{61}$-butyric acid methyl ester (PCBM), perylene-3,4,9,10-tetracarboxyl-bis-benzimidazole (PTCBI), or (PRNM)

(PRNM).

8. The photo device of claim 1, wherein said electron transporting network includes light absorbing material.

9. The photo device of claim 1, wherein said active layer includes elongated nanorods.

10. The photo device of claim 9, wherein said elongated nanorods include at least one carbon nanotube and at least one carbon nanorod formed to include II-VI elements.

11. The photo device of claim 1, wherein said plurality of light absorbing molecules include a plurality of molecules that are of at least two different types.

12. The photo device of claim 1, wherein said plurality of hole transporting molecules or said plurality of electron transporting molecules comprise a plurality of molecules that are of at least two different types.

13. The photo device of claim 1, wherein said plurality of hole transporting molecules and said plurality of electron transporting molecules are configured to absorb light of different wavelengths.

14. The photo device of claim 1, wherein said plurality of hole transporting molecules and said plurality of electron transporting molecules are light absorbing.

* * * * *